United States Patent
Ishikawa et al.

(10) Patent No.: US 6,558,877 B1
(45) Date of Patent: May 6, 2003

(54) JET COATING METHOD FOR SEMICONDUCTOR PROCESSING

(75) Inventors: Akihito Ishikawa, Allen, TX (US); Tomoki Tanaka, Allen, TX (US); Nobuo Takeda, Richardson, TX (US); Masataka Yoshida, Tokyo (JP)

(73) Assignee: Ball Semiconductor, Inc., Allen, TX (US)

( * ) Notice: Subject to any disclaimer, the term of this patent is extended or adjusted under 35 U.S.C. 154(b) by 53 days.

(21) Appl. No.: 09/584,913

(22) Filed: May 31, 2000

Related U.S. Application Data
(60) Provisional application No. 60/137,014, filed on Jun. 1, 1999.

(51) Int. Cl.[7] ............ G03C 1/74; G03C 1/765; G03F 7/16; G03F 7/18; B05D 3/00; B05D 1/02; B05D 7/00

(52) U.S. Cl. ............ 430/311; 430/935; 430/272.1; 430/327; 430/330; 430/501; 430/523; 427/374.3; 427/424; 427/398.1; 427/220; 428/378; 438/758; 438/760; 438/780; 438/782

(58) Field of Search ............ 428/378; 438/758, 438/760, 780, 782; 430/935, 272.1, 270.1, 311, 327, 330, 501, 523; 427/374.1, 374.3, 424, 384, 398.1, 220, 215

(56) References Cited

U.S. PATENT DOCUMENTS

| | | | | |
|---|---|---|---|---|
| 4,608,942 A | * | 9/1986 | Hayashi | 427/424 |
| 4,704,298 A | * | 11/1987 | Herman et al. | 427/34 |
| 5,277,965 A | * | 1/1994 | Malhotra | 428/216 |
| 5,403,617 A | * | 4/1995 | Haaland | 427/180 |
| 5,736,195 A | | 4/1998 | Haaland | 427/180 |
| 5,863,603 A | * | 1/1999 | Sandhu et al. | 427/240 |
| 5,885,661 A | | 3/1999 | Batchelder | 427/425 |
| 5,955,776 A | | 9/1999 | Ishikawa | 257/618 |
| 5,998,109 A | * | 12/1999 | Hirabayashi | 430/434 |
| 6,174,651 B1 | * | 1/2001 | Thakur | 430/327 |
| 6,214,110 B1 | * | 4/2001 | Powell | 118/57 |
| 6,300,020 B1 | * | 10/2001 | Ina et al. | 430/22 |

FOREIGN PATENT DOCUMENTS
WO   WO 98/25090   6/1998

* cited by examiner

*Primary Examiner*—Janet Baxter
*Assistant Examiner*—Sin J. Lee
(74) *Attorney, Agent, or Firm*—Haynes & Boone, LLP

(57) ABSTRACT

A system and method is disclosed for coating a conventional wafer or a spherical shaped semiconductor substrate with liquid material such as photoresist by utilizing a "drop on demand" piezo driven dispense nozzle, a bubble-jet dispense nozzle, or a continuous piezo jet with charging electrodes. The proposed system and method will greatly reduce, and in some cases virtually eliminate, the waste of photoresist in the process.

15 Claims, 5 Drawing Sheets

JET COATING METHOD FOR SEMICONDUCTOR PROCESSING

CROSS REFERENCE

This application claims benefit of U.S. Ser. No. 60/137, 014 filing date Jun. 1, 1999.

BACKGROUND OF THE INVENTION

The present invention relates generally to semiconductors, and more particularly, to a system and method for applying photoresist in a semiconductor manufacturing process.

Semiconductor processing requires several different processing steps, including applying a photoresist coating on a substrate such as a semiconductor wafer. Traditionally, photoresist which is a fluid material including photo active compounds and solvents, is placed on the wafer and then distributed about the wafer. One common distribution method is to spin the wafer, controlling the thickness of the photoresist by the amount of solvent in the photoresist and the spin rate of the wafer. Once the photoresist is dispensed onto the wafer, the wafer will continue to spin at a controlled speed as the film gradually dry off as a uniform coating. Following the spin, the wafers may receive a soft bake process on a hot plate to drive off most of the solvents. This traditional method wastes a significant amount of photoresist, especially at the spinning step.

U.S. patent application Ser. No. 08/858,004 describes a system and method for making spherical shaped semiconductor devices. In the manufacturing process for producing spherical shaped semiconductor devices, it is even harder to obtain an even layer of photoresist on the substrate. In order to achieve a similar evenness of the photoresist layer on a spherical shaped semiconductor substrate, if using the conventional spinning method, a significantly greater amount of photoresist will be wasted since the rotation of the spherical devices is more complex than the two dimensional wafer. Further, the thickness of the layer will be hard to control from device to device for the same reason.

It is desired to evenly coat photoresist onto a substrate without incurring significant amount of waste.

It is also desired to uniformly apply the photoresist to different shaped substrates, including spherical shaped semiconductor substrates.

It is further desired to be able to increase the controllability for the thickness of the film layer.

SUMMARY OF THE INVENTION

What is proposed is a system and method to coat a conventional wafer or a spherical shaped semiconductor substrates or devices with photoresist by utilizing a jet head assembly including one or more jet heads, each having a plurality of dispense nozzles thereon. The positions of these jet heads may be fixed and target objects such as wafers or spherical shaped semiconductor substrates are traveling in one direction and passing in front of the jet heads during the coating process. Multiple control variables such as jet frequency, jet volume, jet velocity, photoresist material viscosity, substrate speed and distance between neighboring substrates can be adjusted to obtain an optimal coating effect. In some embodiments, the proposed system includes a feeder, a jet head assembly, a heat isolator, a dry heating chamber, and a catcher. In addition, unused photoresist may be recycled for future use. The disclosed system and method thus greatly reduce, and in some cases virtually eliminate, the waste of photoresist in the process.

DESCRIPTION OF THE PREFERRED EMBODIMENT

The following disclosure provides many different embodiments, or examples, for implementing different features of the invention. Techniques and requirements that are only specific to certain embodiments should not be imported into other embodiments. Also, specific examples of chemicals, components, and processes are described below to help clarify the invention. These are, of course, are merely examples and are not intended to limit the invention from that described in the claims.

Figure 1:
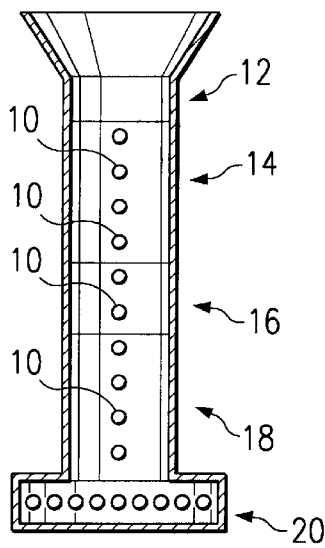
FIG. 1 is a simplified version of a photoresist coating system in accordance with the teachings of the present invention.

Referring now to FIG. 1, one embodiment of a jet coating system is shown in accordance with the teachings of the present invention. A series of spherical shaped semiconductor substrates 10 will come down from the feeder 12, and free fall through a jet coater chamber 14, wherein each substrate will be coated with photoresist of determined thickness by using an assembly of jet heads. Once the photoresist is sprayed onto the substrates 10, they continue falling through a heat isolator 16 where the heat effect from the dry heater below is isolated. Afterwards, the substrates may go through a dry heater chamber 18 for evaporating any unwanted solvents. The substrates finally rest in a catcher 20 at the bottom of the system, which is the last instrument in the photoresist coating process.

Figure 2:
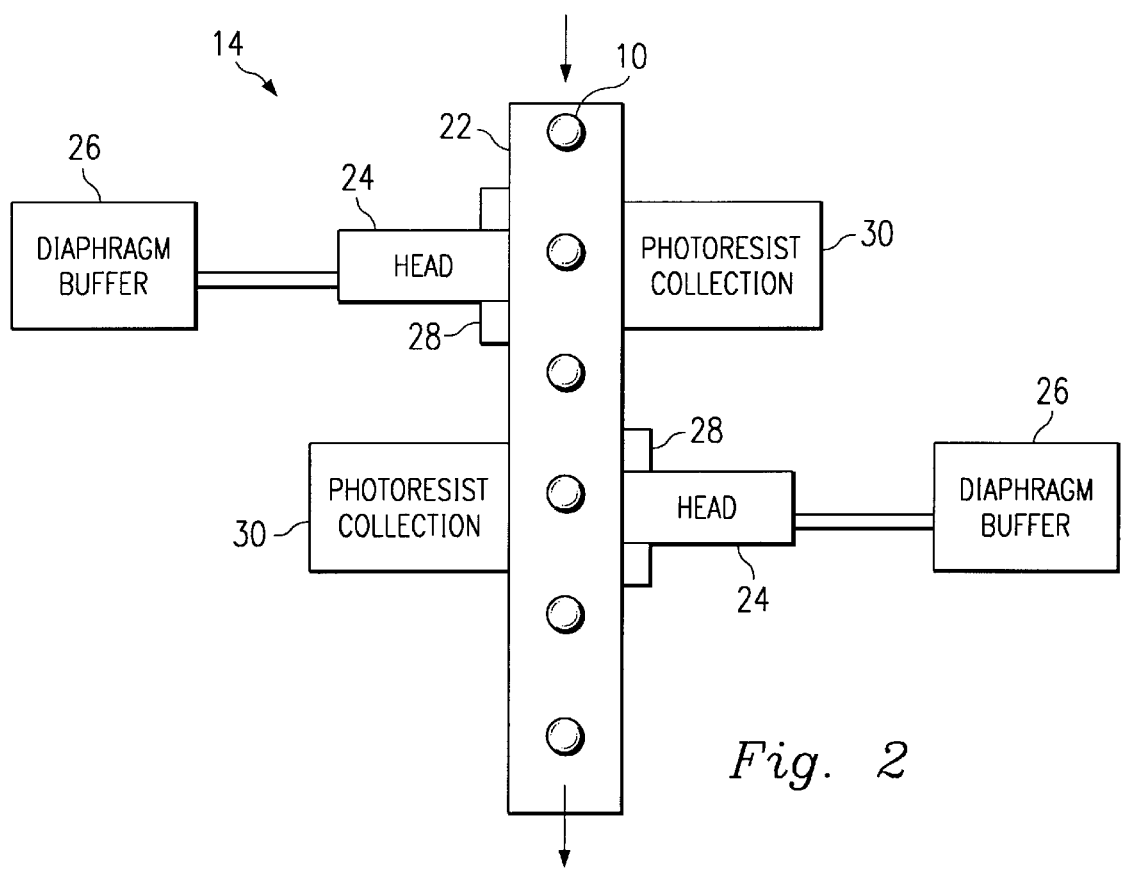
FIG. 2 is an illustration of one embodiment of a jet coater for use in the photoresist coating system of FIG. 1.

FIG. 2 is a detailed illustration of one embodiment of the jet coater chamber 14. While the substrates 10 are free falling in a drop tube 22 in the chamber, an assembly of jet heads can be configured to coat the photoresist. In this particular embodiment, two heads 24 are used. Each head is equalized by a diaphragm buffer 26. A vapor pad 28 can be arranged in conjunction with each head to assure a substantially stable viscosity of the photoresist. The vapor pad 28 provides an agent for maintaining the solvent vapor atmosphere around the dispense nozzles. Excessive photoresist missing the substrates will rest in a photoresist collection chamber 30, whereas clean solvent will constantly cycle through the chamber, and drain out the photoresist for future use. Because the time required to coat the free falling substrate is instantaneous, a slight rotation of the substrate is irrelevant, and when various control factors are adjusted for an optimal configuration, the photoresist will be evenly distributed on the surface of the substrates with a controllable thickness. Some major factors, by no means inclusive, that are very important to this fine tuning are jet frequency, jet volume, material viscosity, jet velocity, substrate speed, and substrate distance. By tuning these factors, material density, dispense volume, film thickness, and coating accuracy will be synchronized to assure coating of photoresist to meet the high standard of the industry.

Further, in this embodiment, two single jet heads are arranged sequentially to give two rounds of coating of photoresist. Various configurations of jet heads will be shown and explained below. The shape of the jet coater chamber can also be designed differently to accommodate a particular jet head configuration.

Figure 3:
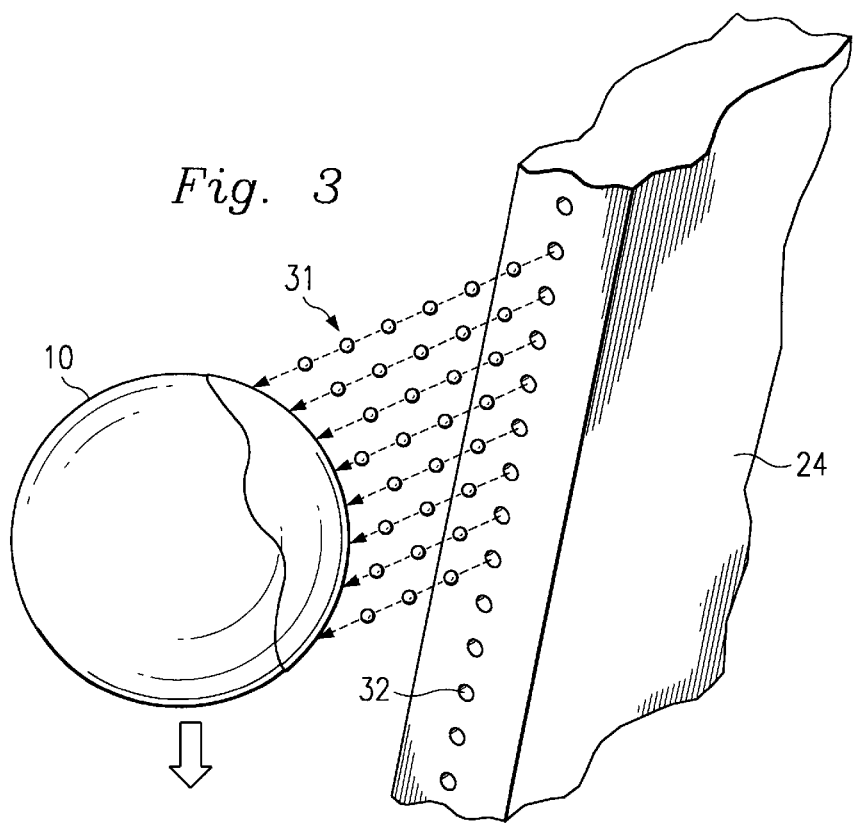
FIG. 3 illustrates one embodiment of a jet head assembly used in the jet coater of FIG. 2.

Now referring to FIG. 3, a detailed layout of a jet head spraying photoresist onto a spherical shaped substrate is shown. It is understood, however, that the size of the substrates and the jet head are out of scale for the sake of illustration. In essence, while a spherical shaped substrate 10 is falling in front of the jet head 24, photoresist drops 31 will be projected from an assembly of dispense nozzles 32. The dispense nozzles can be "drop on demand" piezo driven dispense nozzles, or bubble-jet dispense nozzles, or continuous piezo-jet nozzles with charging electrodes, or any other similar instruments. The position of the jet heads may be fixed while the spherical shaped substrate is moving in one direction during the coating process. The productivity of the entire jet coating system is thus enhanced since substrates need only to travel in one direction and only to go through the jet coater 14 once to have photoresist coated. In this arrangement, multiple control variables such as jet frequency, jet volume, jet velocity, photoresist viscosity, substrate speed and distance between neighboring substrates can be adjusted to obtain an optimal coating effect. Particularly, the volume and the number of photoresist drops made onto the substrate can be precisely controlled to cover the entire surface of the substrate, e.g., a sphere, with an even layer of photoresist film having an appropriate thickness. The thickness of the photoresist film usually can be represented by the following formula, $$\text{Film Thickness} = F(V, N, D_{Solids})$$

whereas V is the volume of the photoresist per pulse per dispense nozzle, N is the number of photoresist drops dispensed onto a targeted substrate surface, and $D_{Solids}$ is the density of the photo active compound in the photoresist. Thus the film thickness is a function of these three variables. The volume of the photoresist per pulse per nozzle, V, is unique to the design of the dispense nozzles. The number of photoresist drops, N, can be determined by the velocity of the targeted substrate, jet frequency and the density of the nozzles on the jet head. For example, a 2 $\mu$m thick photoresist film is obtained when 19,114 pl of the photoresist, with 33% solids, is dispensed onto a sphere of 1 mm diameter. As it is found in the practice, a typical jet frequency is 1~10 kHz, a typical jet volume is 1~1000 pl, a photoresist viscosity is 1~100 cp, a substrate speed can be 0~5 m/s and the distance between any two neighboring substrates usually is 1~100 mm.

The distance between the dispense nozzles can be designed for an optimal result, as can the orientation of the jet head. The jet head can be programed by a control computer to adjust the jet frequency, jet volume, and jet velocity to meet different needs of varying process design. In order to save the photoresist material and thus reduce the production cost, the jet head does not have to spray photoresist constantly. The distance between falling substrates can be controlled in such way that the jet head only needs to spray photoresist periodically, i.e., only when a substrate is in front of it. In another embodiment of the invention, certain dispense nozzles can be activated while the others will be turned off temporarily. For example, when only a very thin layer of photoresist is needed, every other nozzle in the jet head can be disabled so that less photoresist will be dispensed.

Figure 4:
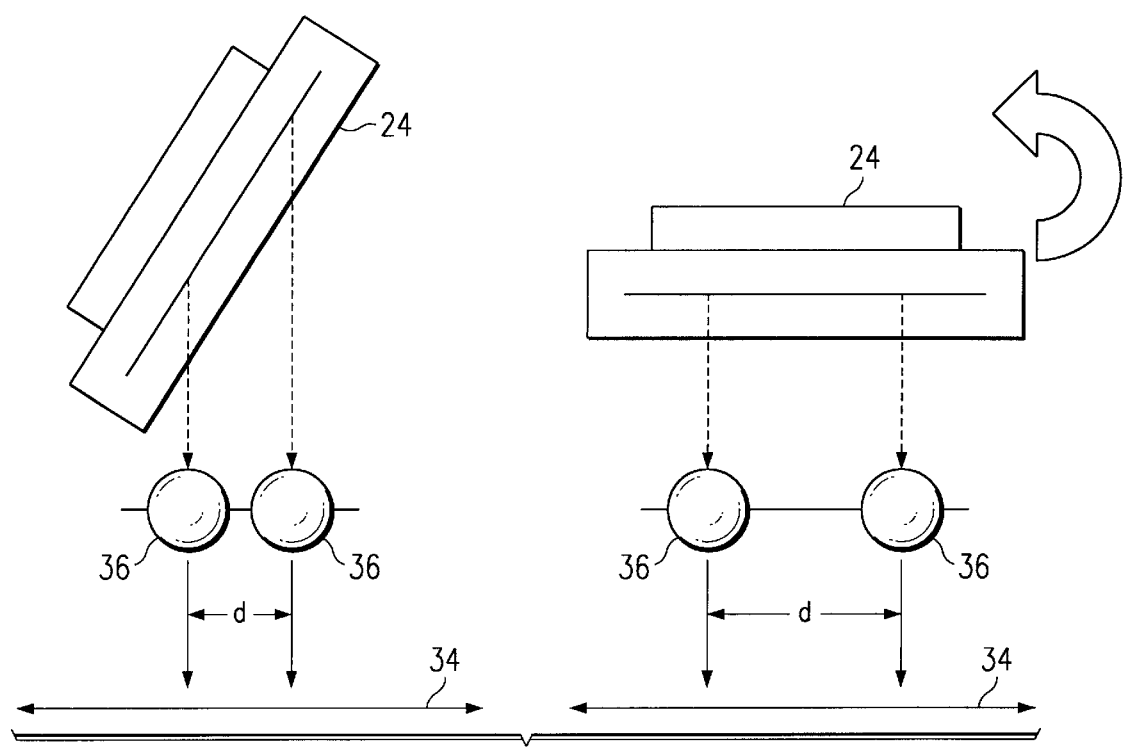
FIG. 4 illustrates a method to increase photoresist density on a series of substrates by adjusting the jet head of FIG. 3.

Referring also to FIG. 4, another embodiment of the invention is shown when a high density of photoresist is necessary in the process. In the present embodiment, all the dispense nozzles are being used and the jet volume and frequency are adjusted to their maximum. As a final tuning step, the jet head can be tilted with respect to the moving path 34 of the substrates to modify the spray density. The distance between any two photoresist drops, labeled as "d" in FIG. 4, will be equal to the distance between two corresponding dispense nozzles. By tilting the jet head 24 to a certain degree, the distance between two same photoresist drops will be reduced, and thus increase photoresist density on the receiving surface of the substrates.

Figure 5A:
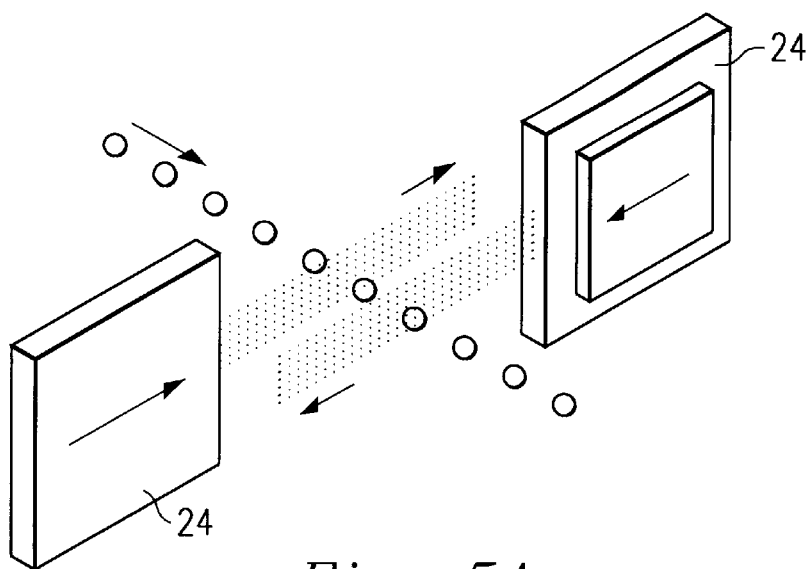
FIGS. 5A—8 present alternative configurations for the jet head s of FIG. 3.
Figure 5B:
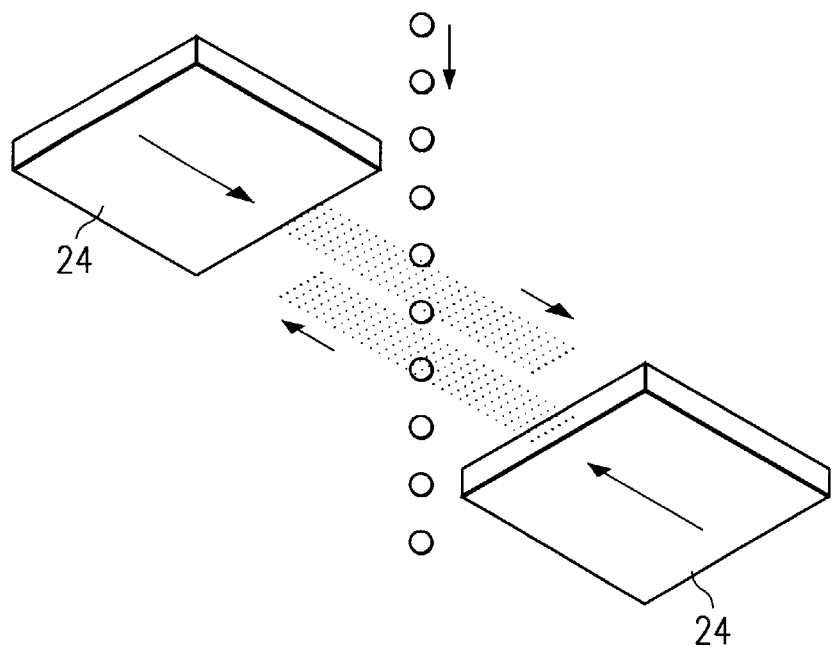

Referring now to FIGS. 5A and 5B, in another embodiment, the jet coater chamber 14 may use two or more jet heads 24 to ensure better spraying of the photoresist. FIG. 5A illustrates the configuration of the two jet heads when the substrates are traveling horizontally. On the other hand, FIG. 5B shows another arrangement when the substrates travel vertically. In both configurations, each jet head can be tilted independently as described in FIG. 4.

Figure 6A:
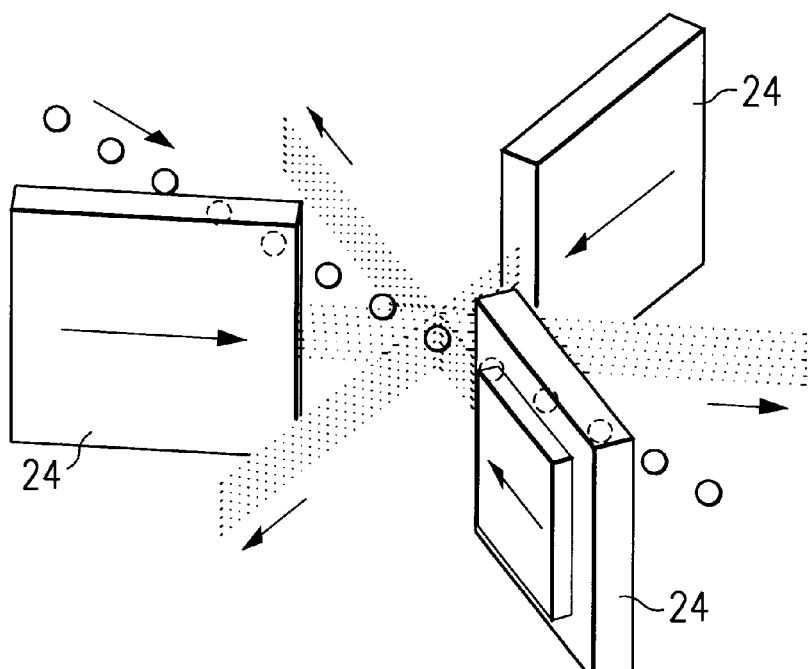
Figure 6B:
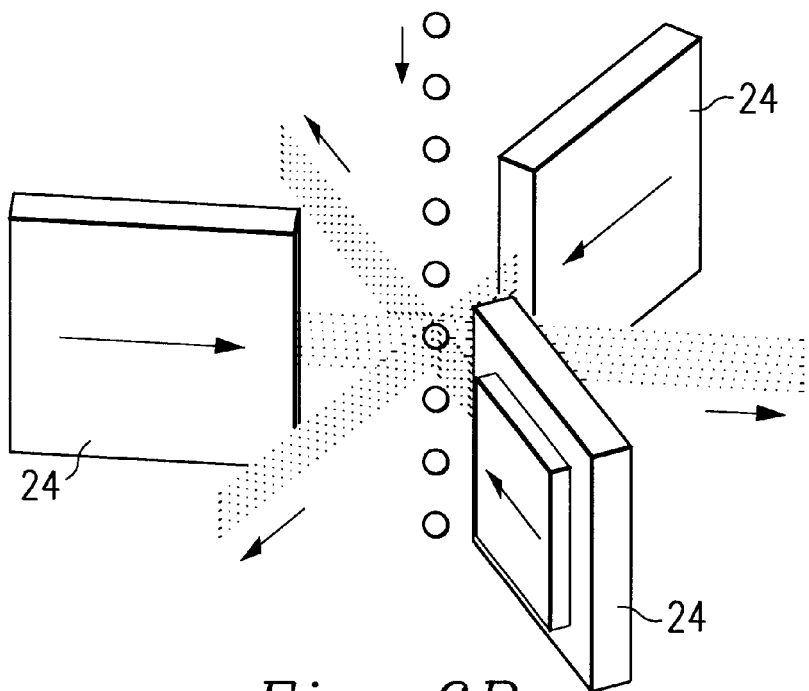

FIGS. 6A and 6B show a more complicated jet head configuration using three jet heads. Other factors being equal, the three head configuration in FIG. 6A will coat less number of substrates at one time than the configuration shown in FIG. 6B since the orientations of all three jet heads are parallel to the vertical travel path of the substrates, and thus cover more substrates at any moment.

Figure 7A:
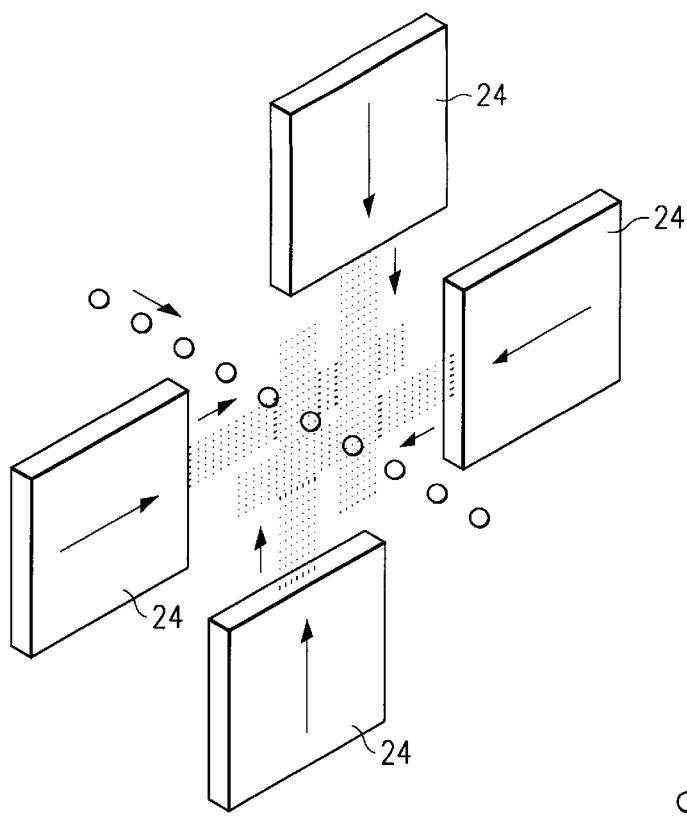
Figure 7B:
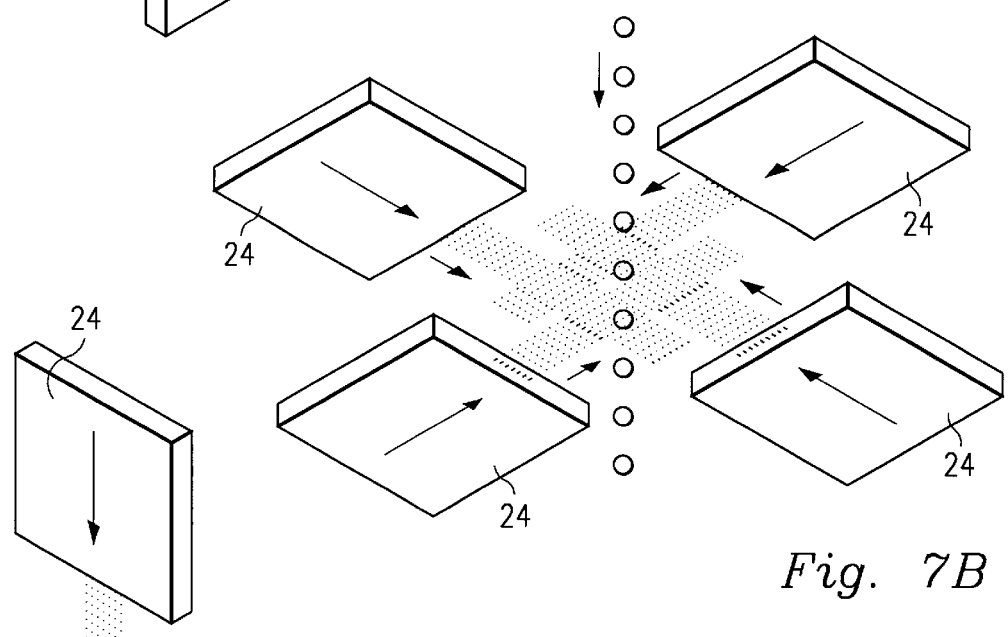

Similarly, FIG. 7A and 7B illustrates a four jet head configuration for substrates traveling horizontally and vertically.

Figure 8:
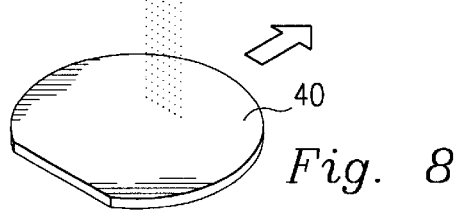

In FIG. 8, another embodiment uses the jet head to coat photoresist on a two-dimensional flat wafer 40. Unlike free falling substrates where the photoresist is required to cover all surface of the sphere, only one side of the wafer 40 needs to be coated. The wafer 40 can be handled mechanically instead of free falling, in a direction that exposes its surface for receiving the photoresist. In one embodiment, as shown here, one jet head can be made long enough to cover the whole wafer. Therefore, photoresist can be evenly spray onto the surface while the wafer is traveling in front of the dispense nozzles.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for coating photoresist for processing semiconductors, the method comprising the steps of:

feeding a stream of spherical shaped semiconductor substrates;

setting up an assembly of jet heads;

coating photoresist onto the substrates by utilizing one or more jet heads, each including one or more bubble jet dispense nozzles;

cooling the coated substrates;

drying the coated substrates; and catching the coated substrates;

wherein each of the steps are performed in a continuous manner to complete the photoresist coating process.

2. The method of claim 1 wherein the step of setting up an assembly of jet heads further includes the steps of:

arranging an orientation of the jet heads;

storing photoresist in a buffer connected to the jet heads; and cycling a chemical solvent for collecting unused photoresist jetted out from the jet heads.

3. A method for coating photoresist for processing semiconductors, the method comprising the steps of:

feeding a stream of spherical shaped semiconductor substrates; and coating photoresist onto the substrates by utilizing an assembly of jet heads, at least one jet head having one or more bubble jet dispense nozzles;

wherein the spherical shaped semiconductor substrates are free falling while the photoresist is coated.

4. The method of claim 3 further including a step of cooling the coated substrates.

5. The method of claim 3 further including a step of drying the coated substrates.

6. The method of claim 3 further including a step of catching the coated substrates.

7. The method of claim 4 wherein the step of coating further includes the steps of:

arranging an orientation of the jet heads;

storing photoresist in a buffer connected to the jet heads; and cycling a chemical solvent for collecting unused photoresist jetted out from the jet heads.

8. A method for coating liquid material onto a flat target surface, the method comprising:

forming a plurality of drops of said liquid material;

coating said liquid material onto said target surface by utilizing an assembly of jet heads wherein the plurality of drops are expelled from the jet heads and are controllably dispensed onto said flat target surface; and allowing said target surface to free fall while coating.

9. The method of claim 8 wherein said liquid material is photoresist.

10. The method of claim 8 wherein the coating further includes setting up an assembly of jet heads.

11. The method of claim 10 wherein the setting up an assembly of jet heads further includes:

arranging an orientation of the jet heads;

feeding photoresist in a buffer connected to the jet heads; and cycling a chemical solvent for collecting unused photoresist jetted out from the jet heads.

12. The method of claim 8 wherein each jet head includes a plurality of dispense nozzles so that the target surface can be coated by periodically jetting out photoresist from the dispense nozzles onto said target surface.

13. The method of claim 12 wherein the dispense nozzles are piezo driven dispense nozzles.

14. The method of claim 12 wherein the dispense nozzles are bubble-jet dispense nozzles.

15. The method of claim 12 wherein the dispense nozzles are continuous piezo jet nozzles with charging electrodes.

* * * * *